US 6,798,689 B2

(12) United States Patent
Müller et al.

(10) Patent No.: US 6,798,689 B2
(45) Date of Patent: Sep. 28, 2004

(54) INTEGRATED MEMORY WITH A CONFIGURATION OF NON-VOLATILE MEMORY CELLS AND METHOD FOR FABRICATING AND FOR OPERATING THE INTEGRATED MEMORY

(75) Inventors: Gerhard Müller, Meitingen (DE); Till Schlösser, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/444,546

(22) Filed: May 23, 2003

(65) Prior Publication Data

US 2003/0206465 A1 Nov. 6, 2003

Related U.S. Application Data

(63) Continuation of application No. PCT/DE01/04091, filed on Oct. 29, 2001.

(30) Foreign Application Priority Data

Nov. 23, 2000 (DE) .......................................... 100 58 047

(51) Int. Cl.[7] .......................... G11C 11/00; G11C 11/14
(52) U.S. Cl. ........................ 365/158; 365/171; 365/173
(58) Field of Search ................................ 365/158, 171, 365/173

(56) References Cited

U.S. PATENT DOCUMENTS

| 4,500,905 | A | | 2/1985 | Shibata ........................ 357/68 |
| 6,097,625 | A | * | 8/2000 | Scheuerlein ................. 365/171 |
| 6,351,408 | B1 | | 2/2002 | Schwarzl et al. ............ 365/158 |
| 6,462,981 | B2 | * | 10/2002 | Numata et al. .............. 365/158 |
| 6,490,190 | B1 | | 12/2002 | Ramcke et al. ............. 365/158 |
| 2003/0161180 | A1 | * | 8/2003 | Bloomquist et al. ........ 365/173 |
| 2004/0002193 | A1 | * | 1/2004 | Smith et al. ................. 438/257 |

FOREIGN PATENT DOCUMENTS

| DE | 197 44 095 A1 | 4/1999 |
| EP | 0 387 834 A2 | 9/1990 |
| EP | 0 613 148 A2 | 8/1994 |
| EP | 0 918 334 A2 | 5/1999 |
| WO | 00/04555 | 1/2000 |

OTHER PUBLICATIONS

Durlam, M. et al.: "Nonvolatile RAM based on Magnetic Tunnel Junction Elements", IEEE International Solid–State Circuits Conference, Feb. 8, 2000, pp. 130–131.

* cited by examiner

*Primary Examiner*—Son Mai
(74) *Attorney, Agent, or Firm*—Laurence A. Greenberg; Werner H. Stemer; Gregory L. Mayback

(57) ABSTRACT

An integrated memory with a configuration of non-volatile memory cells based on ferromagnetic storage contains both powerful memory cells with a magnetoresistive effect with a transistor control and cost-effective memory cells with a magnetoresistive effect with memory elements connected between the word lines and bit lines. The memory elements connected directly between the bit line and the word line are preferably inserted in memory cell arrays that can be stacked one above the other above the memory cells with the transistor, and thereby achieve a high integration density. The fact that the memory, which contains both types and thereby satisfies all the system requirements, is fabricated in one module and in one process sequence considerably lowers the fabrication costs.

7 Claims, 3 Drawing Sheets

INTEGRATED MEMORY WITH A CONFIGURATION OF NON-VOLATILE MEMORY CELLS AND METHOD FOR FABRICATING AND FOR OPERATING THE INTEGRATED MEMORY

CROSS-REFERENCE TO RELATED APPLICATION

This application is a continuation of copending International application PCT/DE01/04091, filed Oct. 29, 2001, which designated the United States and which was not published in English.

BACKGROUND OF THE INVENTION

Field of the Invention

The present invention relates to an integrated memory with a configuration of non-volatile memory cells and to a method for fabricating and for operating the integrated memory.

Non-volatile memories are used in many systems with discrete memory modules, the selection of the memory modules used depend on the specific requirements of the respective system. Usually, use is made both of modules containing a memory with fast reading and writing times, e.g. static random access memory (SRAM), and of more cost-effective modules with slower access but a higher integration density of the memory elements, e.g. flash memory.

In addition to other architectures of non-volatile memory, for instance ferroelectric memory (FeRAM), ferromagnetic memories (MRAM) have also been proposed for use in discrete modules, the storage in cells being achieved with the aid of the magnetoresistive effect. This exploits the fact that the electrical resistance of two ferromagnetic layers depends on the mutual orientation of a magnetic polarization of the layers. Thus, a state "0" may correspond to the electrical resistance with a parallel direction of polarization, and the state "1" can correspond to the electrical resistance with an antiparallel direction of polarization. However, the difference in the electrical resistance between the two possible orientations amounts to only 15% for giant magnetoresistive effect (GMR) elements through to 50% for tunneling magnetoresistive effect (TMR) elements.

The elements which contain two ferromagnetic layers and are isolated by a dielectric layer are fitted at the points of intersection of the mutually crossing bit lines and word or write lines, so that there is an electrical connection from the bit line via the GMR or TMR resistance to the word line. By measuring the current via the active bit line and word line, respectively, with the aid of sense amplifiers, it is possible to determine the electrical resistance and thus to determine the mutual orientation of the magnetic polarization of the ferromagnetic layers.

Depending on the embodiment of an MRAM cell, it is possible, by an additional write line which is parallel to the word line and is insulated from the ferromagnetic element or by a write line which is identical to the word line, to generate, using bit and write lines that are connected to carry current, by superposition at their crossover point, such a large magnetic field that it becomes possible to effect a rotation encompassing 180 degrees of the magnetic direction of polarization of a first variable ferromagnetic layer relative to the second ferromagnetic layer, whose magnetic orientation is fixed. If a network of bit lines which run parallel and word or write lines which run transversely with respect thereto is used analogously to the structure of conventional dynamic memories (i.e. dynamic random access memory (DRAM)), then addressing of the memory cells for reading and writing is made possible with the aid of corresponding column and row drivers.

There are essentially two possibilities for the construction of memory cells with a magneto-resistive effect. A first embodiment is disclosed e.g. by Durlam et al., titled "Non-volatile RAM based on Magnetic Tunnel Junction Elements", given at International Solid State Circuits Conference, IEEE, 2000, pages 130 to 131, in which case, by using a selection transistor in the memory cell, a current path from the bit line via the ferromagnetic memory element to the earth potential can be activated by the word line. For the write operation, the transistor is turned off by the word line, while a current flows through the write line. The architecture affords the advantage of a very fast access time of a few nanoseconds but cannot make use of the possibilities of very small dimensioning as a result of the ferromagnetic element, since the area occupied is determined by the significantly larger selection transistor and, as in the conventional dynamic memory (DRAM), turns out to be $8F^2$ where F is the minimum feature size on the substrate.

By contrast, International Publication No. WO 99/14760 A1, corresponding to U.S. Pat. No. 6,490,190 B1, discloses an architecture of a ferromagnetic memory in which the memory element with a magnetoresistive effect is connected directly between the bit line and word line, in which case the current on the selected bit line can be evaluated by a sense amplifier without using a selection transistor. Parasitic current paths can occur, caused by a comparatively high internal resistance of the word or bit lines relative to the resistance of the memory cell with a magnetoresistive effect. Moreover, the current intensities to be measured differ only by 10 to 30% for the two states of the memory cell, so that the resistances of the ferromagnetic elements must be given very high values from the outset. Since a selection transistor is avoided in this architecture, a high integration density of the memory cells can therefore be achieved with a cell area of $4\ F^2$.

However, this advantage must be weighed against the disadvantage of a long access time of 0.5–1 µs.

By assembling discrete modules containing memory cells with a magnetoresistive effect, it is possible, as in the case of electrical storage, to construct memory modules which satisfy the respective system requirements, e.g. by using both memory with a fast access time and memory with a high integration density in two discrete modules. However, the inherent disadvantages of the individual modules are also transferred to the overall system, and at the same time lead disadvantageously to considerably higher fabrication costs.

SUMMARY OF THE INVENTION

It is accordingly an object of the invention to provide an integrated memory with a configuration of non-volatile memory cells and a method for fabricating and for operating the integrated memory that overcome the above-mentioned disadvantages of the prior art devices and methods of this general type, which has low costs for the fabrication thereof and, at the same time, enables a high integration density with fast reading and writing times.

The object is achieved by an integrated memory with a configuration of non-volatile memory cells. The memory cells include at least a first and a second memory cell with a magnetoresistive effect, which are disposed at crossover points in each case between bit lines and word lines running transversely with respect thereto. The first memory cell with a magnetoresistive effect contains a transistor which can be driven by the word line and which forms, for an access to the first memory cell with a magnetoresistive effect, with the bit line and a first memory element, a current path to a supply or earth potential. A second memory element of the second memory cell with a magnetoresistive effect is connected between a respective bit line and a respective word line.

According to the present invention, the advantageous configuration of a non-volatile memory with a fast access time and a high integration density is realized within a discrete memory module. Through a combination of elements in the integrated memory, namely the memory cells with a magnetoresistive effect with transistor and the memory cells with a magnetoresistive effect that are connected e.g. directly between the bit line and the word line, it is possible, depending on system requirements, to create flexible, fast and inexpensive memory modules which, by virtue of the integration on a discrete module, have considerably lower fabrication costs.

The two architectures used for memory cells with a magnetoresistive effect are preferably in each case equipped with dedicated sets of word and bit lines. To that end, it is then also necessary to provide corresponding sets of drivers for the memory cell arrays thus produced and also a corresponding logic for the addressing. On the other hand, a common configuration within a memory cell array is also possible. While the memory cell arrays with a magnetoresistive effect with selection transistors are generally linked to the monocrystalline silicon substrate, other embodiments of the relative configuration can also be taken into account for the memory cells that are directly connected between the bit line and word line. Moreover, an even more effective integration density can be achieved by space-saving association to other components on the memory module or on a logic module with an associated memory.

A further advantageous configuration of the present invention achieves a stacking of the memory cell arrays, which are composed of the memory cells with a magnetoresistive effect with the transistor in the bottommost, substrate-side plane and of the memory cells with memory elements connected between the bit line and word line in the planes that follow above the former plane, from the substrate plane into higher layers. This achieves a maximum number of memory cells per substrate base area, the stacking depth depending only on the driver logic and its inevitably increasing distance from the respective memory cell array. On the other hand, it is also the case that, with an increasing stacking depth, the proportion of fast memory containing memory cells with a magnetoresistive effect with transistors becomes smaller and smaller, so that higher integration densities, faster access and lower fabrication costs are advantageously achieved with a balanced combination containing proportions of both memory types.

In a further configuration of the invention, a combination of memory cells with GMR elements and with TMR elements is also considered. This embodiment enables a further grading of performance and costs within the memory.

In a further configuration of the present invention, the targeted breakdown of the dielectric barrier layer in the TMR element is considered, the barrier layer having a thickness of just a few nanometers. This is achieved by applying a high voltage to the relevant cells, after which the direction of polarization of the freely adjustable ferromagnetic layer is coupled to that of the fixed ferromagnetic layer and is thus likewise fixed. The state of the polarization orientation of the memory cell with a magnetoresistive effect thus permanently corresponds to that at which the breakdown was carried out. This makes it possible to realize a powerful fixedly preprogrammed read-only memory (ROM).

A further configuration of the present invention constitutes the memory cell with a diode. The latter may be provided in particular for the case where the memory cell is not controlled by a transistor. In this case, the diode is connected in series with the memory element between the word line and bit line. This enables a method that makes it possible to prevent parasitic currents by a suitable voltage distribution over the word and bit lines of the memory cells.

In this method, which is used for reading from a memory cell with a magnetoresistive effect with the diode, of all the word lines of the memory cell array, that word line which traverses the memory cell to be read is operated with a higher voltage, while all the other word lines are operated with a lower, second voltage. As in the conventional case, although the bit line of the memory call to be read is operated with the second, lower voltage, all the other bit lines are controlled with the first, higher voltage operated like that for the word line of the memory cell to be read. As a result, a voltage gradient is present only between the word line and the bit line of the memory cell to be read. For all the other memory cells, either identical voltages or voltage slopes are present. In this case, the diodes in the memory cells prevent opposite currents from flowing. This effectively prevents parasitic current paths. As a result, the resistances of the memory elements can be given lower values and the access speeds can advantageously be increased.

A further advantageous configuration of the present invention relates to the common assignment of bit or word lines to memory cells from memory cell arrays lying one above the other. In this case, no insulating layers are situated between the memory cells or memory cell arrays lying one above the other, rather the lines of the lower memory cell array which lie at the top are used in a reverse configuration as line of the same type from the overlying layer of memory cells. Although this only enables an alternate access to the respective memory cell arrays and, consequently, does not increase the memory access rate overall, the number of process steps for fabricating the memory cell arrays, in particular the number of lithography steps, can nonetheless be considerably reduced. This results in a considerable saving of fabrication costs and an even higher integration density.

The advantage of combining the two types of memory cells with a magnetoresistive effect in exactly one integrated memory becomes particularly clear in the method for fabricating the configuration. Specifically, the stacking from the bottommost memory cell layer on the substrate through to the topmost memory cell layer containing memory cells which are connected between word and bit lines can be produced in one process sequence. The method includes the steps of providing a substrate, forming a first memory cell having a transistor and a magnetoresistive effect on the substrate using a CMOS process, producing an insulating layer subsequently above the first memory cell, and forming a second memory cell with a magnetoresistive effect on the insulating layer.

Other features which are considered as characteristic for the invention are set forth in the appended claims.

Although the invention is illustrated and described herein as embodied in an integrated memory with a configuration of non-volatile memory cells and a method for fabricating and for operating the integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
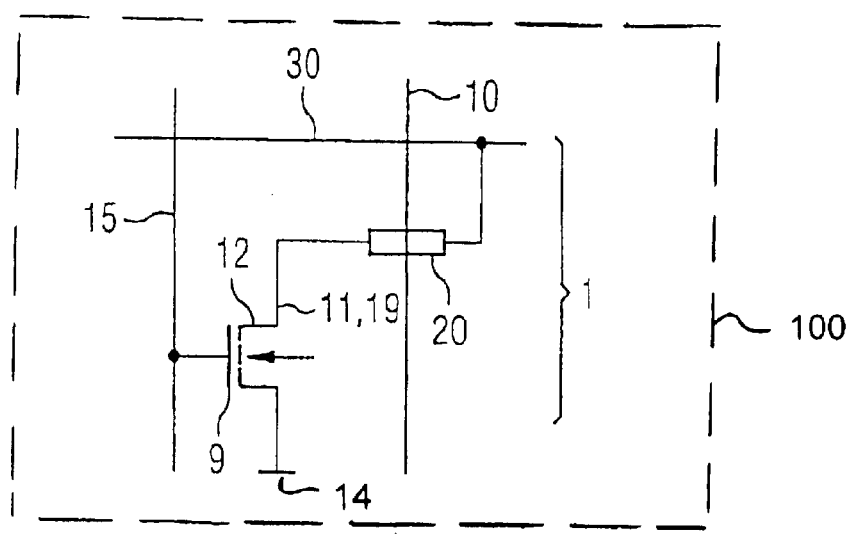
FIGS. 1A–1C are equivalent circuit diagrams for memory cells with a magnetoresistive effect with a transistor (FIG. 1A), with a memory element directly connected between a word line and a bit line (FIG. 1B), and with a memory element and a diode connected in series between the word line and the bit line (FIG. 1C)
Figure 1B:
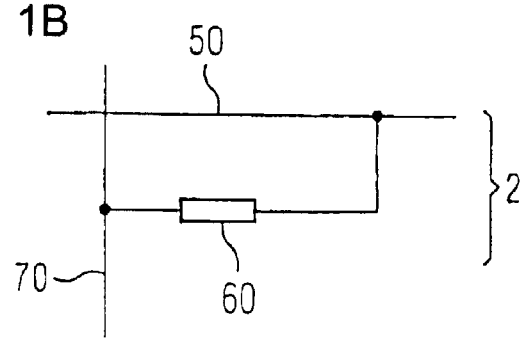

Referring now to the figures of the drawing in detail and first, particularly, to FIGS. 1A–1B thereof, there is shown an integrated memory which by way of example contains two types of memory cells, whose equivalent circuit diagrams are illustrated in FIGS. 1A and 1B. Situated on a substrate 100 on a substrate side (see FIG. 1A) there is a multiplicity of memory cells having a magnetoresistive effect 1 with a transistor 9 at a crossover points between word lines 15, which are preferably parallel among one another, and bit lines 30 respectively running transversely with respect thereto. In order to read out information, the word line 15 turns the transistor 9 on, which enables a current path from the bit line 30 via a magnetoresistive memory element 20, a strap contact 19 and a metal contact 11 to an earth potential 14. Instead of the earth potential 14, a feedback line with a voltage supply is also possible. The use of the transistor 9 ensures that only the above-mentioned current path is present, that is to say, in particular, no appreciable currents can escape via memory elements 20 of other, non-selected word lines 15, since their transistors 9 are in an off state.

In order to write information, a write line 10 which is in each case parallel to the word line 15 and runs in proximity to the memory element 20 is supplied with current, so that, with simultaneous activation of the bit line 30, a sufficiently large, superposed magnetic field is induced which influences the magnetic polarization in the memory element 20.

The substrate-side array of memory cells which is spanned by the bit and word lines has a further memory cell array superposed on it—in a manner isolated by an insulating layer. A memory cell with a magnetoresistive effect 2 of this array is shown in FIG. 1B. A current flows therein via a memory element 60 to the bit line 50 for the purpose of readout with the word line 70 activated. A signal can be generated therefrom by use of e.g. an inverting sense amplifier, which signal can be evaluated by assignment to one of the two polarization states of the active memory element.

Figure 1C:
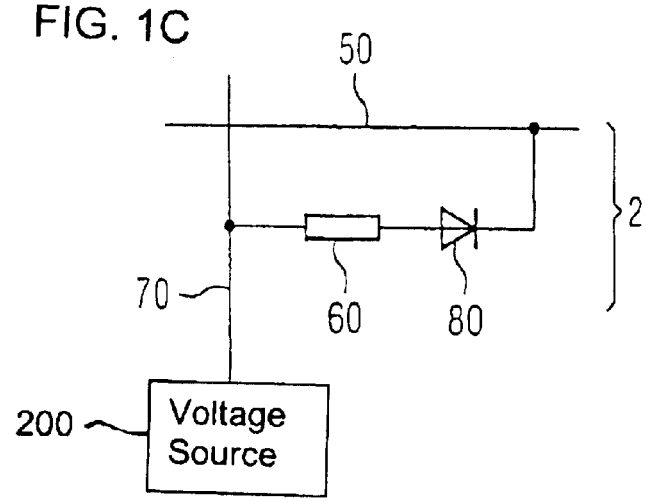

In order to prevent parasitic current paths which possibly occur in this architecture, in an extended embodiment, the insertion of a diode 80 into the current path between the word line 70 and the bit line 50 may be considered, this being illustrated in FIG. 1C. If the word line 70 associated with the memory cell to be read is controlled with e.g. 3 volts and all the other word lines are controlled with 0 volts, and the bit line 50 associated with the memory cell to be read is controlled with 0 volts and all the other bit lines 70 are controlled with 3 volts, a positive voltage difference between the word line 70 and the bit line 50 results only for the current path through the memory element 60 to be read, as a result of which only the diode 80 associated with the memory element is operated in the forward direction.

For writing information, the same mechanism is used for this type of memory cells as for the memory cell with a magnetoresistive effect 1 with the transistor 9, except that in this example the word line 70 itself is used as the write line.

Figure 2A:
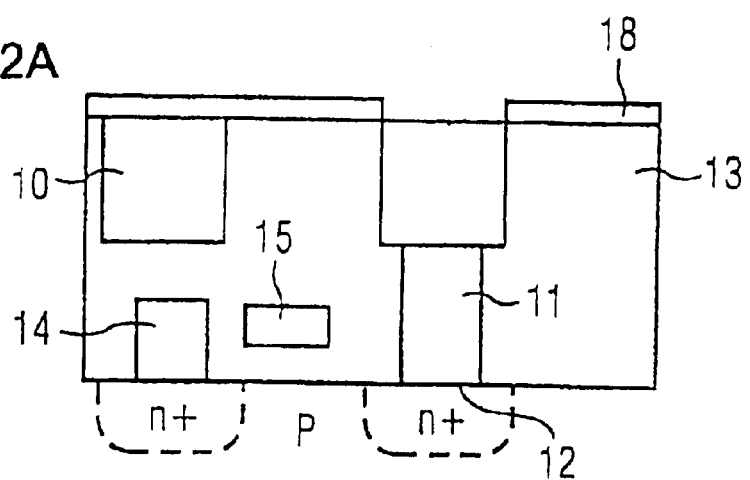
FIGS. 2A–2E are diagrammatic, cross-sectional views through the memory cells during a process sequence for fabricating the integrated memory in five successive steps.
Figure 2B:
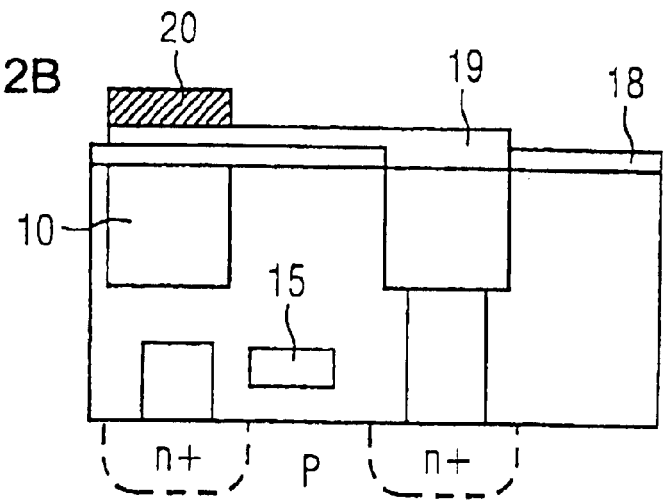

To fabricate the configuration of memory cells mounted one above the other, the bottommost memory cell 1 with a magnetoresistive effect is constructed in a conventional manner in the CMOS basic process, with respect to which, on the substrate side, with respect to the transistor 9, there is a transistor contact 12 via a metal contact 11, as is shown in FIG. 2A. A gate electrode associated with the transistor represents the word line 15 of the memory cell 1 with the transistor 9. The metal contact 11 is insulated by an oxide and nitride layer 13, through which the write line 10 also runs perpendicularly through the figure plane in FIG. 2A. A thin dielectric layer of about 10 to 20 nm is deposited onto this planarized layer and the metal contact 11 is uncovered in a lithography and etching step. After the application of the metal layer for the strap contact 19, the TMR film for the memory element 20 is deposited and both layers are reduced to the desired form structure by lithography and etching steps, as is shown in FIG. 2B.

Figure 2C:
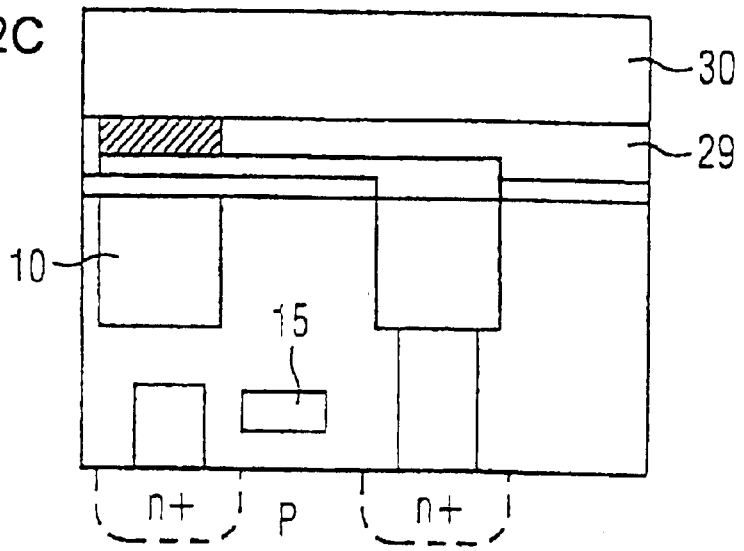

After the deposition and planarization of a further insulation layer 29, the bit line 30 is patterned as a metal line in further deposition, lithography, etching, metal deposition and planarization steps, as can be seen in FIG. 2C. This step concludes the construction of the memory cell with a magnetoresistive effect 1 with transistor.

Figure 2D:
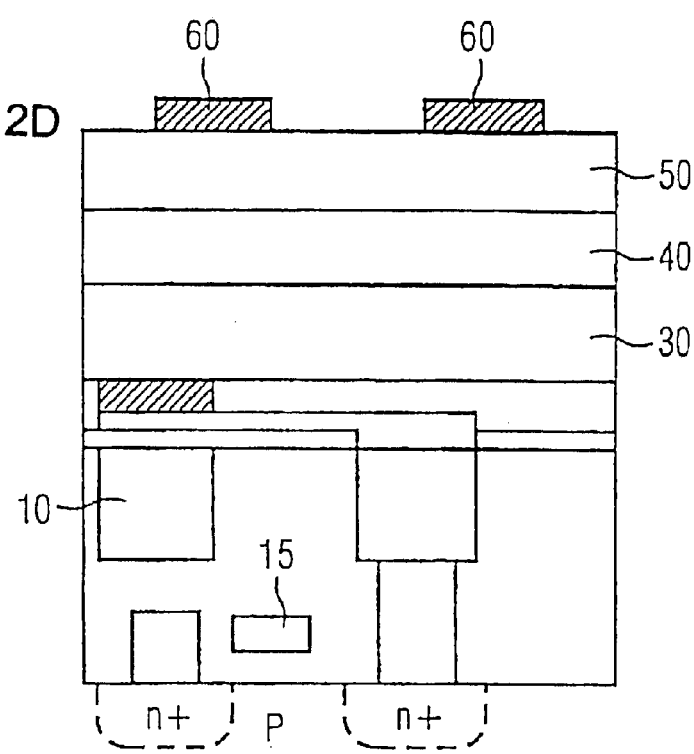
Figure 2E:
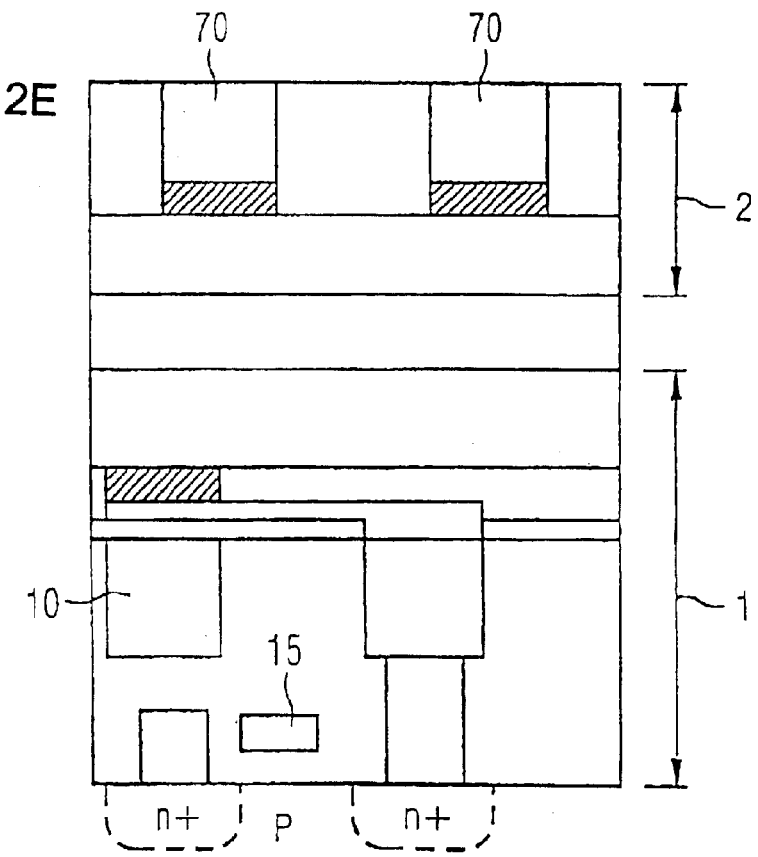

In order to achieve a high integration density and thus low fabrication costs, a second memory cell with a magnetoresistive effect 2 is mounted above the memory cell with a magnetoresistive effect 1. As illustrated in FIG. 2D, to that end, first a further insulation layer 40, containing plasma nitride and oxide, is applied, after which the bit line 50 is introduced as a third metallization plane in a further lithography and etching step with subsequent copper deposition. After chemical mechanical planarization, the TMR film for the memory element 60 is applied, which contains the two ferromagnetic layers isolated by a thin dielectric layer. As can be seen from FIG. 2D, a higher packing density of memory elements is achieved for the second memory cell plane than in the first, lower memory plane, the reason for this residing in the area of the transistor adjoining beneath the transistor contact 12, whereas the area of the upper memory cell illustrated in FIG. 2D is dominated by the size of the memory element 60 or the minimum line distance between two lines.

After the application of a further insulation layer, a lithography and etching step and the filling of the trenches of the fourth metal plane with copper, the word lines 70 are obtained, which now enclose the memory elements 60 containing TMR film between them and the bit lines 50. The production of the memory cell 2 with the magnetoresistive effect is then also concluded after further planarization and insulation. In subsequent layers, memory cells with a magnetoresistive effect 2 can then be repeatedly stacked one above the other. In an extension of this implementation example, by integrating a device 200 for the application of a voltage of e.g. 10 volts to the word line 70 in the memory module, it is possible to achieve the targeted breakdown of the dielectric layer between the two ferromagnetic layers in the memory cells, the dielectric layer having a thickness of only approximately 1–2 nm according to the present prior art. This corresponds to the realization of one-time programmable memories according to the present invention.

In order to fabricate a combination of 1 Gb cost-effective mass memory and 128 Mb fast, powerful memory in this implementation example, from the memory cells 1 having the magnetoresistive effect and with the transistor 9, a substrate-side layer of 128 Mb is made available for the memory cell array which provides a non-volatile memory, and at the same time offers the performance of static electric memory (SRAM). Since the area requirement of the memory cell 2 with a magnetoresistive effect, amounting to $4\,F^2$, is only half of the area requirement of the memory cell 1 with the transistor 9, four layers of this type of more cost-effective mass memory, with 256 Mb, can be stacked directly above the memory cell array existing on the substrate side. In this case, it is necessary merely to take account of the reservation of substrate area for the drivers of the memory cell arrays.

Consequently, a memory with fast access, a low degradation rate in comparison with electric memory, and a high integration density and thus low fabrication costs is made available.

We claim:

1. An integrated memory, comprising:

bit lines;

word lines running transversely with respect to said bit lines; and a configuration of non-volatile memory cells including first memory cells and second memory cells each having a magnetoresistive effect, said non-volatile memory cells disposed at crossover points in each case between said bit lines and said word lines;

said first memory cells each containing a first memory element connected to a bit line and a transistor connected to and driven by one of said word lines, for an access to a respective one of said first memory cells, said transistor with said bit line and said first memory element forming a current path to one of a supply potential and earth potential;

said second memory cells each having a second memory element connected between a respective bit line and a respective word line.

2. The integrated memory according to claim 1, wherein said non-volatile memory cells are disposed in a substrate, said first memory cells form a substrate-side memory cell array, and said second memory cells form a memory cell array disposed above said substrate-side memory cell array.

3. The integrated memory according to claim 1, wherein one of said first and second memory elements has a giant magnetoresistive effect and the other has a tunneling magnetoresistive effect.

4. The integrated memory according to claim 2, further comprising a device for applying a high voltage to said bit lines and said word lines for breaking down a thin dielectric layer in said first and second memory elements, said device connected to at least one of said memory cell array and said substrate-side memory cell array.

5. The integrated memory according to claim 2, wherein each of said second memory cells has a diode connected in series with said second memory element disposed between said respective word line and said respective said bit line.

6. The integrated memory according to claim 2, wherein in each case one of said first memory cells and one of said second memory cells lying one above another from different ones of said substrate-side memory cell array and said memory cell array are connected to a bit line being a common bit line.

7. An integrated memory, comprising:

bit lines;

word lines running transversely with respect to said bit lines; and a configuration of non-volatile memory cells including at least a first memory cell and a second memory cell each with a magnetoresistive effect, said non-volatile memory cells disposed at crossover points in each case between said bit lines and said word lines;

said first memory cell containing a first memory element connected to one of said bit lines and a transistor connected to and driven by one of said word lines, for an access to said first memory cell, said transistor with said bit line and said first memory element forming a current path to one of a supply potential and earth potential;

said second memory cell having a second memory element connected between a respective one of said bit lines and a respective one of said word lines.

* * * * *